United States Patent [19]

Weimer

[11] Patent Number: 5,182,700
[45] Date of Patent: Jan. 26, 1993

[54] METHOD AND APPARATUS FOR CONNECTING A DEVICE TO A PRINTED CIRCUIT BOARD

[75] Inventor: Charles M. Weimer, Norwalk, Conn.

[73] Assignee: Pitney Bowes Inc., Stamford, Conn.

[21] Appl. No.: 733,490

[22] Filed: Jul. 22, 1991

[51] Int. Cl.[5] .............................................. H05K 7/02
[52] U.S. Cl. ..................................... 361/400; 29/840; 228/180.1; 228/212; 361/419
[58] Field of Search .................. 29/840; 361/400, 417, 361/419, 420; 228/180.1, 180.2, 212

[56] References Cited
U.S. PATENT DOCUMENTS
4,953,061 8/1990 Nitkiewicz ............................ 29/840

Primary Examiner—P. W. Echols
Attorney, Agent, or Firm—Donald P. Walker; Melvin J. Scolnick

[57] ABSTRACT

A process for connecting a switch to a printed circuit board comprising the steps of, providing a printed circuit board having at least one aperture formed therein, providing a switch including a housing having at least one electrical terminal extending therefrom, providing a fastener made of a molded plastic material capable of withstanding a soldering environment, mounting the switch on the board such that the at least one terminal thereof extends through the at least one board aperture, connecting the switch to the board by means of a fastener and wave-soldering the at least one terminal to the printed circuit board after the connecting step.

24 Claims, 3 Drawing Sheets

METHOD AND APPARATUS FOR CONNECTING A DEVICE TO A PRINTED CIRCUIT BOARD

BACKGROUND OF THE INVENTION

This invention is generally concerned with a method and apparatus for connecting a device to a printed circuit board and more particularly with a method and apparatus for connecting a microswitch to a printed circuit board.

In U.S. Pat. No. 4,905,980 for a Control Circuit For Single Revolution Means, issued Mar. 6, 1990 to John R. Nobile, et. al. and assigned to the assignee of the present invention, there is disclosed a mailing machine which includes a control circuit having a plurality of switches which are actuated by associated mechanical structures for controlling timely operation of the machine. In practice, the switches have been mounted on a printed circuit board by means of metal screws, prior in time to soldering the electrical terminals of the switches to the board, in order to ensure that the switches are connected to the board in predetermined positions thereon, wherein the switches may be properly actuated by the mechanical structures with which they are associated for timely operation of the machine. However, the switches have persistently become loosened from the boards in the course of repeated operation of the machine, with the result that the switches are dislocated from their predetermined positions on the board and oftentimes electrically disconnected from the control circuit. Whereupon machine malfunctions have occurred due to untimely or faulty operation of either or both of the switches.

As shown in U.S. Pat. No. 4,057,520 for a Slide Switch Assembly * * * Mounted on Printed Circuit Board, issued Nov. 8, 1977 to E.L. Schwartz, U.S. Pat. No. 4,705,241 for a Switch Mounting Device, issued Nov. 10, 1987 to A. Sadao, et. al., and U.S. Pat. No. 4,778,965 for a Switch Construction With Integral Mounting Clips, issued Oct. 18, 1988 to J. Valenzona, it is known in the art to provide structures other than metal screws for fastening switches to printed circuit boards. On the other hand, such fastening structures are not known for use in an application wherein the manufacturing step of fastening a switch to the circuit board, or in a critical position thereon, precedes the step of wave-soldering the switch to the board, as a result of which the fastening structure must survive the high temperature, corrosive, environment of molten solder.

Accordingly:

an object of the invention is to provide a method and apparatus for connecting a device to a printed circuit board;

another object is to provide a method and apparatus for connecting a switch in a predetermined location on a printed circuit board; and another object is to provide a method and apparatus for connecting a switch to a printed circuit board, in a predetermined location thereon, for subsequently soldering the switch thereto.

SUMMARY OF THE INVENTION

A process for connecting a switch to a printed circuit board comprising the steps of, providing a printed circuit board having at least one aperture formed therein, providing a switch including a housing having at least one electrical terminal extending therefrom, providing a fastener made of a molded plastic material capable of withstanding a soldering environment, mounting the switch on the board such that the at least one terminal thereof extends through the at least one board aperture, connecting the switch to the board by means of the fastener, and wave-soldering the at least one terminal to the printed circuit board after the connecting step.

DESCRIPTION OF THE PREFERRED EMBODIMENTS

Figure 1:
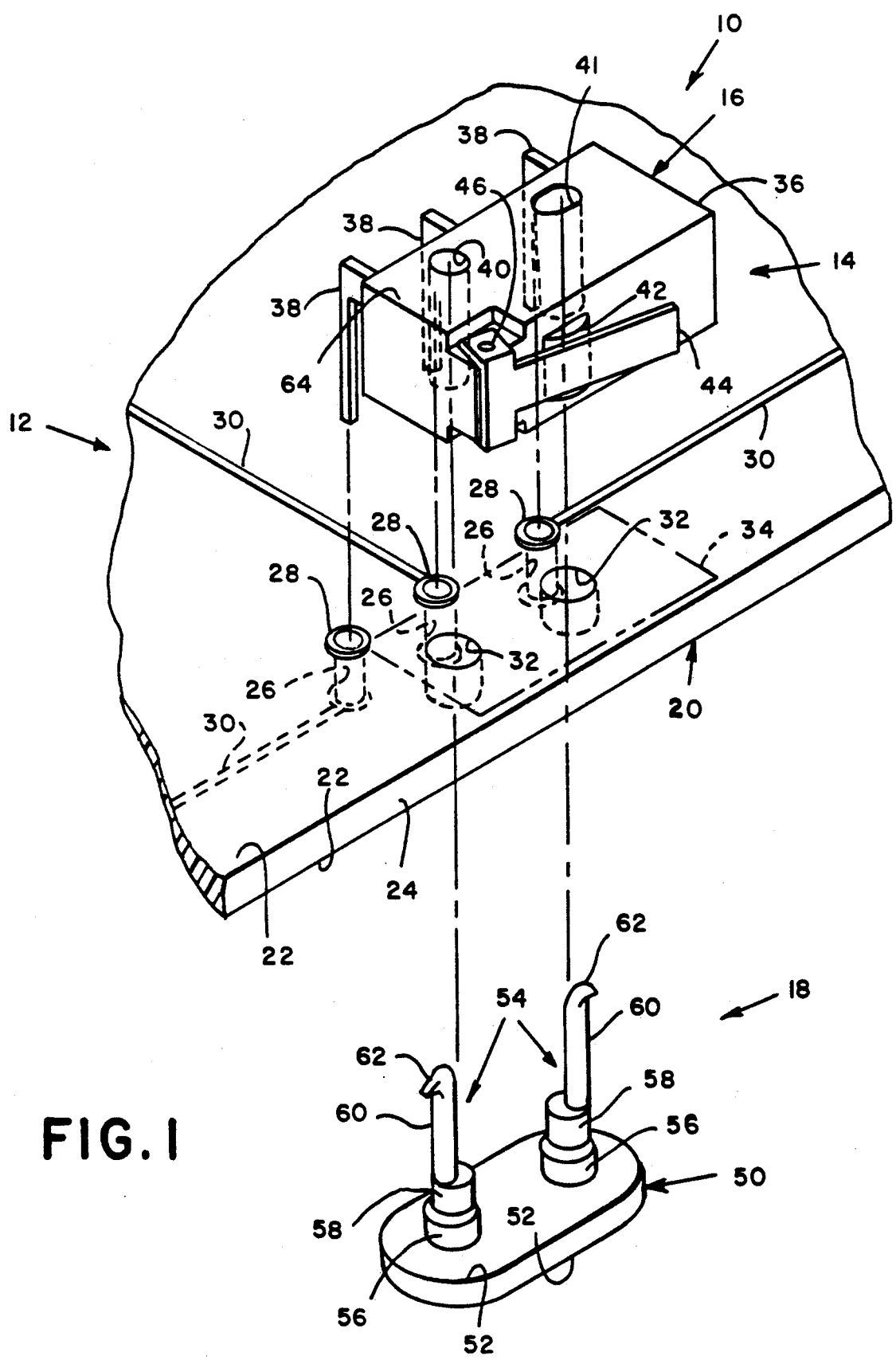
FIG. 1 is an exploded perspective view of a printed circuit board, having a switch connected thereto by means of a fastener in accordance with the invention.

As shown in FIG. 1, the apparatus 10 according to the invention generally includes a printed circuit board 12, a device 14, which is preferably a switch 16, mounted on the board 12, and fastening structure 18 for connecting the device 14, such as the switch 16, to the board 12.

The circuit board 12 (FIG. 1) comprises a conventionally constructed, substantially flat, substrate 20, made of a resin impregnated plastic material such as fiberglass, which includes opposed surfaces 22, and a plurality of edges 24, one of which is shown. In addition, the board 12 includes at least one and preferably a plurality of first apertures 26 which are formed in the substrate 20, at predetermined locations, so as to extend between the surfaces 22. The board 12 also includes a like number of generally cylindrically-shaped, electric current conductive, annulets 28 which are plated, bonded or otherwise conventionally connected to each of the apertures 26 so as to extend between the surfaces 22. Further, the board 12 includes a like number of elongate, electric current conductive, leads 30, each of which are also plated, bonded or otherwise conventionally connected to either of the opposed substrate surfaces 22 so as to extend from a different one of the annulets 28 and to form therewith an electric current conductive circuit element. Moreover, the board 12 preferably includes a plurality of openings 32 which are formed in the substrate 20 at predetermined locations relative to the respective annulets 28, so as to define therewith a predetermined position 34 in which the device 14, and thus the switch 16, is mounted and connected to the board 12.

The device 14 (FIG. 1) may be any electrical component of the type which is mountable on a printed circuit board 12, such as a resistor, capacitor or inductance, or transistor or other solid state element, switch, relay or transformer, or the like, having a housing 36, provided with one or more elongate electric current conductive terminals 38 extending therefrom, and a pilot aperture 40 and guide aperture 41 formed therein. On the other hand, in the preferred embodiment the device 14 is a microswitch-type of switch 16, and includes a housing 36 having the same number of terminals 38 extending therefrom as there are annulets 28 in the board 12 and having the same number of apertures 40 formed therein as there are openings 32 formed in the board 12. Moreover, the switch terminals 38 and apertures 40 are arranged in a location pattern relative to one another which corresponds to the pattern of location of the board's apertures and openings, 26 and 32, relative to one another. In addition, the switch 16, includes a conventional switch actuating element 42, which is actuatable for operating the switch 16, and, may or may not include a conventional lever arm 44, which is suitably pivotably attached to the housing 36, as by means of a pivot pin 46, so as to extend outwardly from the housing 36 and into overhanging relationship with respect to the actuating element 42, to permit the arm 44 to be moved toward and away from the housing 36 for actuating the element 42.

The fastening structure 18 (FIG. 1) generally comprises a molded plastic member which is capable of withstanding the high temperature, corrosive, environment of molten solder, and, more particularly, comprises a resilient member which is injection molded from a polyetherimide plastic known in the trade as ULTEM. The fastening structure 18 includes an elongate, generally rectangularly-shaped, base portion 50, having opposed surfaces 52. In addition, the fastening structure 18 includes a pair of elongate, parallel-spaced, arm portions 54 which are integrally formed with the base portion 50 so as to extend substantially perpendicularly outwardly of one of the base portion's surfaces 52. Each of the arm portions 54 includes a first section 56, which longitudinally extends outwardly of the base portion 50 from the base portion's surface 52. At least one of the first sections 56 is preferably selectively dimensioned in transverse cross-section for fitting within a selected one of the circuit board's openings 32, for locating the arm portion 54, and thus the fastening structure 18, relative to the board 12. In addition, each of the arm portions 54 includes a second section 58, which longitudinally extends outwardly of the base portion 50 from the first section 56. At least one of the second sections 58 is preferably selectively dimensioned in transverse cross-section for fitting within a selected one of the housing apertures 40 and 41, for locating the housing 36 relative to the arm portion 54. Further, each of the arm portions 54 includes a third section 60, which longitudinally extends outwardly of the base portion 50 from the second section 58. Each of the third sections 60 is preferably selectively dimensioned in transverse cross-section throughout the length thereof to be less than that of the second section 58 and to be gradually reduced in cross-sectional dimension, longitudinally of the length thereof, as it extends from the second section 58. And, each of the arm portions 54 includes a fourth section 62, which forms the free end of the arm portion 54 and which longitudinally extends outwardly of the base portion 50 from the third section 58, and is selectively dimensioned to transversely extend from the arm portion 54.

Figure 2:
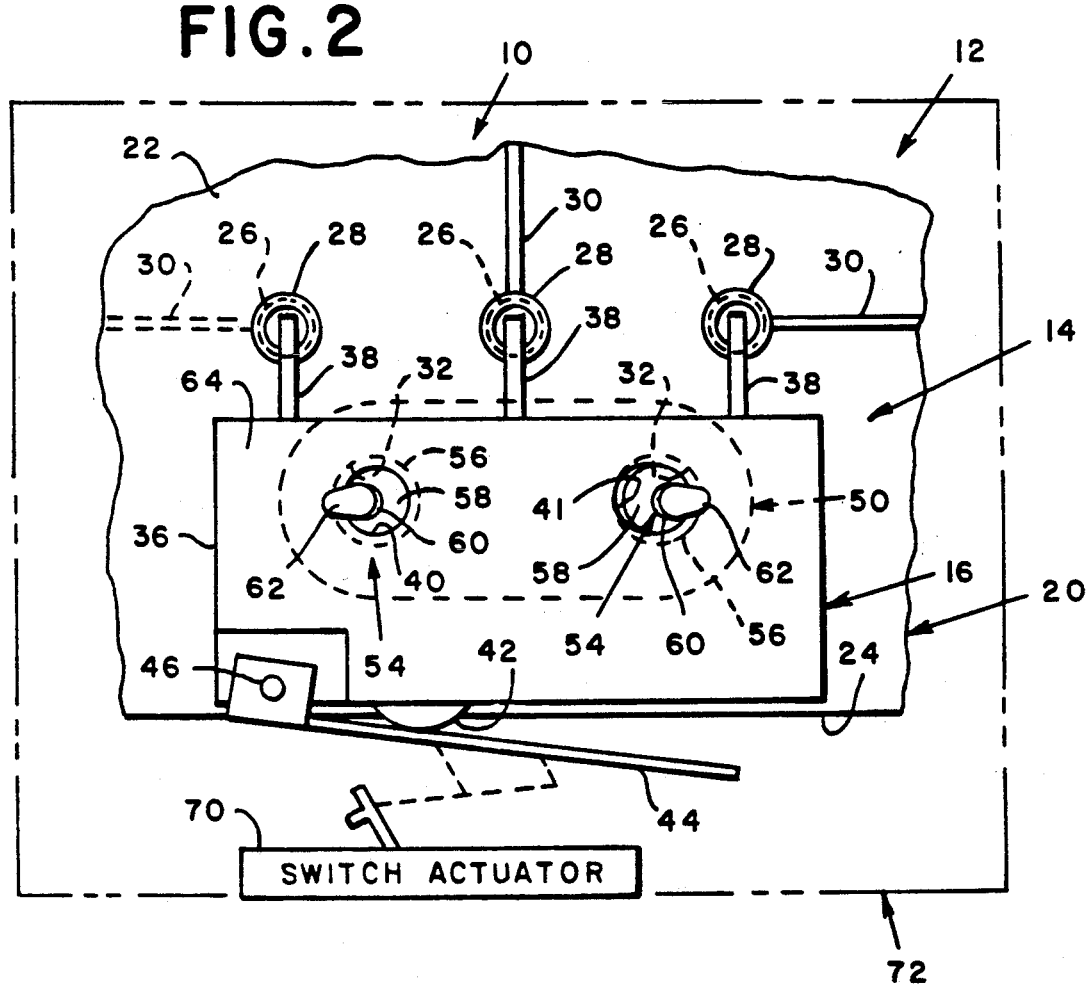
FIG. 2 is a top view of the structure shown in FIG. 1, assembled in accordance with the invention.
Figure 3:
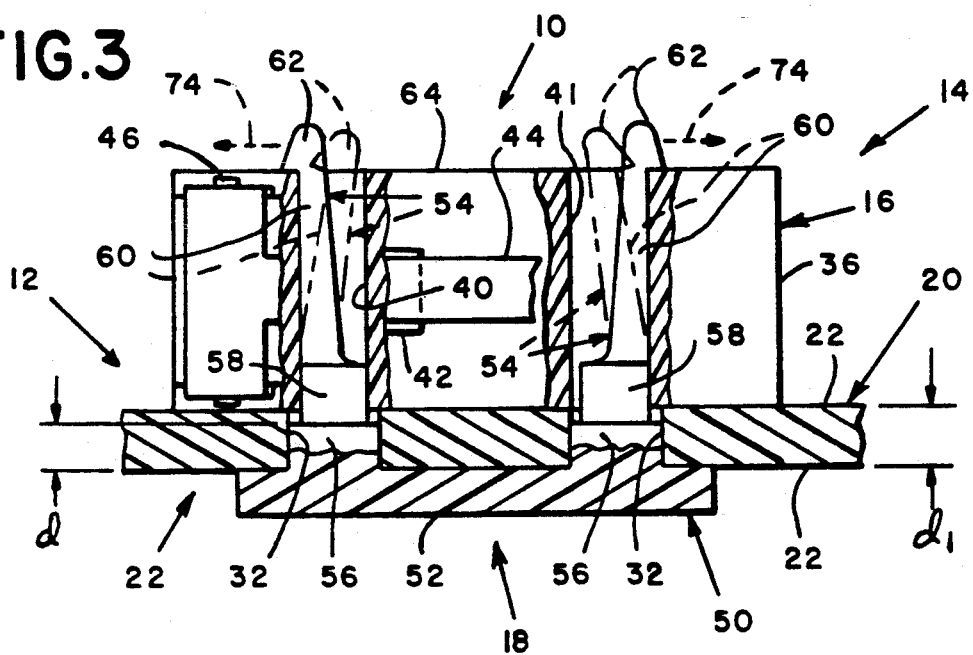
FIG. 3 is a sectional elevational view of the structure shown in FIG. 2, taken substantially along the line 3—3 thereof.

As thus constructed and arranged, the device 14 (FIG. 1), as exemplified by the switch 16, is mountable on a selected surface 22 of the board 12 in the predetermined position 34 thereon, by locating the housing's terminals 38 and apertures 40 and 41, respectively, opposite the selected surface 22 and in alignment with the board's annulets 28 and openings 32, and then inserting the terminals 28 into and through the annulets 28, and thus through the board's first apertures 26, until the switch housing 36 is seated in its predetermined position 34 on the board 12. Thereafter, the switch 16 is connected to the board 12 utilizing the fastening structure 18, by locating the arm portions 54, respectively, opposite the other board surface 22 and in alignment with the board's openings 32, and then inserting the arm portions 54 into and through the board's openings 32 and the switch housing's apertures, 40 and 41 until the base portion's surface 52, from which the arm portions 54 extend, is seated in surface-to-surface contact with the other board surface 22. As shown in FIG. 3, in the course of connecting the switch 16 to the board 12, the third sections 60 of each of the fastening structure's arm portions 54 are cammed toward one another, against the resilient force 74 exerted by the arm portion's free ends 62, due to the free ends 62 engaging the apertures, 40 and 41 in the course of passage of the free ends 62 therethrough. Thus the arm portion's free ends 62 resiliently move into latching engagement with the outer surface 64 of the switch housing 36 when the free ends 62 clear the housing apertures, 40 and 41, for clamping the switch housing 36 into surface-to-surface engagement with the board 12. Preferably, to facilitate such surface-to-surface engagement the height "d" (FIG. 3) of the arm portion's first sections 56 are selectively dimensioned to be less than the thickness "$d_1$" of the borad's substrate 20, to avoid protrusion of the first sections 56 beyond the substrate surface 22 when the switch housing 36 is clamped into engagement with the board 12. And, as shown in FIG. 2, when the switch 16 is mounted and connected to the board 12 in the predetermined position 34 (FIG. 1) thereon, the switch actuating element 42 and, assuming the provision thereof, the lever arm 44, overhangs one of the substrate edges 24, to permit actuation by suitable external structure 70 of a conventional mailing machine base 72 which includes the apparatus 10 according to the invention.

Figure 4:
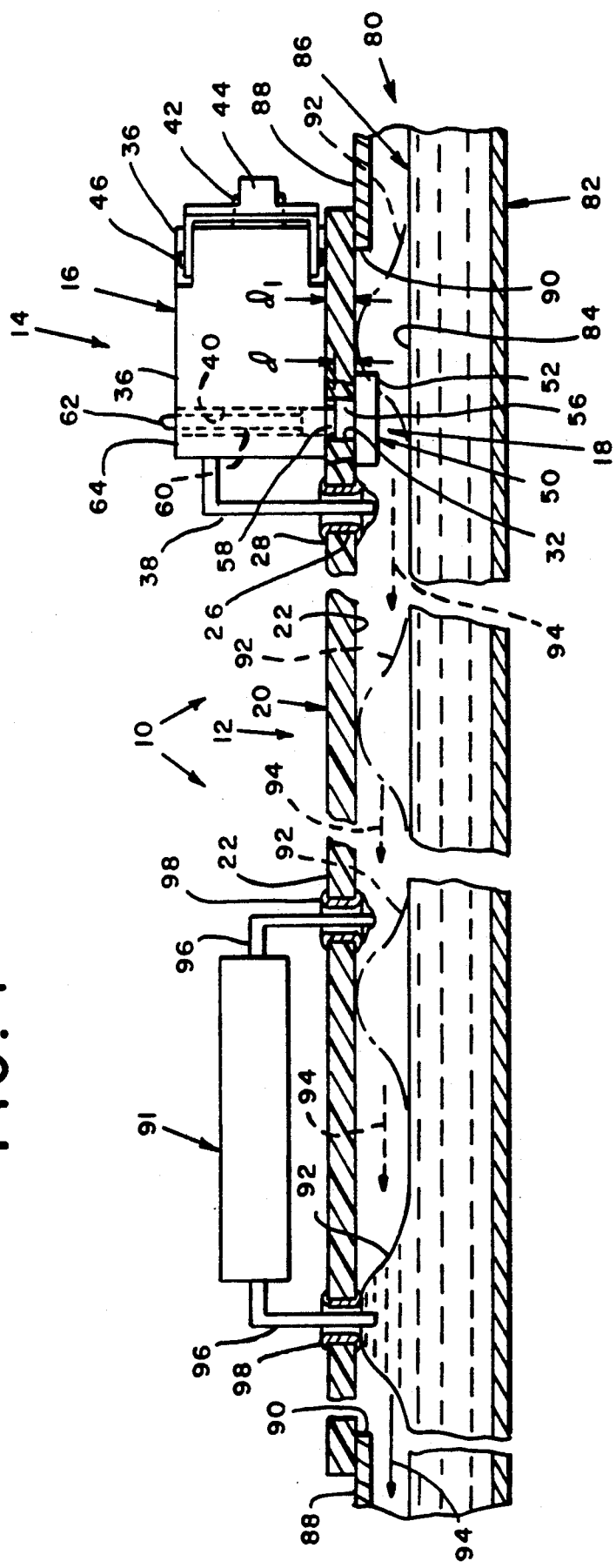
FIG. 4 is a sectional elevational view of conventional wave-soldering apparatus showing the manner in which a switch, fastened to a printed circuit board in accordance with the invention, is thereafter soldered thereto in accordance with the invention.

As shown in FIG. 4, typical wave-soldering structure 80 which may be utilized for soldering the switch terminals 38 to the board annulets 28, after the switch 16 is mounted on and connected to the board 12, comprises a suitable elongate container 82 which is filled to an appropriate level 84 with a mass of molten solder 86 and which includes an upper wall 88 having an opening 90 formed therein. Preferably, the container's opening 90 is conventionally dimensioned to permit the printed circuit board 12, with the switch 16 mounted thereon and fastened thereto, and optionally with any other circuit element 91 mounted thereon, to be supported by the container's upper wall 88 in a manner such that the switch terminals 38 and board annulets 28 are located within the container's opening 90 and in overhanging relationship with the mass of molten solder 86. In addition, the wave soldering structure 80 includes conventional structure (not shown) for propagating a wave 92 in the mass of molten solder 86 which moves longitudinally of the length of the container 82 in the direction of the arrow 94, for bathing the lower surface 22 of the board 12, and thus the switch terminals 38, annulets 28 and the fastening structure's base portion 50, as well as any other electrical component terminals 96 and board annulets 98, in molten solder 86, thereby soldering the terminals, 38 and 96, to their respectively associated annulets, 28 and 98, for forming an electrically conductive circuit paths therewith.

According to the invention, the electrically conductive terminals 38 (FIG. 4) of device 14, as exemplified by the switch 16, are preferably conventionally wave-soldered to the printed circuit board 12, for example as hereinbefore described, after the switch 16 is both mounted on and connected to the board 12, in order to ensure that the switch 16 is held stationary and retained in place in its predetermined position 34 (FIG. 1) on the board 12 before, during and after the terminals 38 are soldered to the board 12. And, as a result of implementing this process, it is imperative that the fastening structure 18 be made of a material which is able to withstand the high temperature, corrosive, environment to which it is subjected in the course of immersion of the fastening structure 18 (FIG. 4) in molten solder 88 when wave-soldering the switch terminals 38 to the annulets 28.

In accordance with the objects of the invention there has been described a method and apparatus for connecting a device to a printed circuit board, and, more particularly for connecting a switch to a printed circuit board, in a predetermined position thereon, and subsequently soldering the switch thereto.

What is claimed is:

1. A process for connecting a switch to a printed circuit board comprising the steps of:
    a. providing a printed circuit board having formed therein at least one aperture and at least one opening;
    b. providing a switch including a housing having at least one opening formed therein and having at least one electrical terminal extending therefrom;
    c. providing a fastener made of a molded plastic material capable of withstanding a soldering environment;
    d. mounting the switch on the board such that the at least one terminal thereof extends through the at least one board aperture;
    e. connecting the switch to the board by means of the fastener, the connecting step including the step of inserting the fastener into each of the at least one openings; and
    f. wave-soldering the at least one terminal to the printed circuit board after the connecting step.

2. The process according to claim 1, wherein step (c) includes the step of injection molding the fastener from polyetherimide plastic.

3. The process according to claim 1, wherein step (c) includes the step of integrally molding in the fastener a base portion and a latch portion opposite the base portion; and step (e) includes the steps of disposing the base portion in engagement with the board and latch portion in engagement with the housing.

4. The process according to claim 1, wherein step (c) includes the step of injection molding the fastener in a generally U-shaped configuration including a base portion and a pair of oppositely-spaced arm portions extending therefrom and respectively having a latch portion at the free end thereof; and step (e) includes the steps of disposing the base portion in engagement with the board and disposing the latch portions in engagement with the housing.

5. The process according to claim 4, wherein the step of providing at least one board opening includes the step of providing one opening having a predetermined transverse dimension; the step of providing at least one housing opening including the step of providing a pilot aperture having a predetermined transverse dimension; step (c) including the step of molding in one of the arm portions a first section thereof dimensioned to fit into said one of said at least one board opening for aligning the fastener with the board; and step (c) including the step of molding in said one of the arm portions a second section thereof dimensioned to fit into said pilot aperture for aligning the switch with the fastener.

6. A process for connecting a switch to a printed circuit board comprising the steps of:
    a. providing a fastener made of a molded plastic material capable of withstanding a soldering environment;
    b. providing a printed circuit board having formed therein at least one aperture and means for receiving the fastener;
    c. providing a switch including a housing having formed therein means for receiving the fastener and having at least one electrical terminal extending therefrom;
    d. mounting the switch on the board such that the at least one terminal thereof extends through the at least one board aperture;
    e. connecting the switch to the board by means of the fastener, the connecting step including the step of disposing the fastener in the respective fastener receiving means; and
    f. wave-soldering the at least one terminal to the printed circuit board after the connecting step;
    g. wherein step (a) includes the step of injection molding the fastener in a generally U-shaped configuration including a base portion and a pair of oppositely-spaced arm portions extending therefrom and respectively having a latch portion at the free end thereof; and
    h. wherein step (e) includes the steps of disposing the base portion in engagement with the board and disposing the latch portions in engagement with the housing.

7. Apparatus comprising:
    a. a printed circuit board having at least one aperture formed therein;
    b. a switch including a housing having at least one electrical terminal extending therefrom, the switch mounted on the board such that the at least one terminal thereof extends through the at least one board aperture, the terminal soldered to the board; and
    c. a fastener for connecting the switch to the board before the at least one housing terminal is soldered thereto, and the fastener made of the molded plastic material capable of withstanding a soldering environment;
    d. wherein the board includes at least one opening formed therein, the housing includes at least one opening formed therein, and the fastener is inserted into each of the at least one openings.

8. The apparatus according to claim 7, wherein the fastener is injection molded from a polyetherimide plastic.

9. The apparatus according to claim 7, wherein the fastener has an integrally molded base portion and an integrally molded latch portion opposite the base portion; the base portion is disposed in engagement with the board; and the latch portion is disposed in engagement with the housing.

10. The apparatus according to claim 7, wherein the fastener is injection molded in a generally U-shaped configuration including a base portion and a pair of oppositely-spaced arm portions extending therefrom and respectively having a latch portion at the free end thereof; the base portion is disposed in engagement with the board; and the latch portions are disposed in engagement with the housing.

11. The apparatus according to claim 10, wherein the at least one board opening includes one opening having a predetermined transverse dimension; the at least one housing opening including a pilot aperture having a predetermined transverse dimension; one of the arm portions including a first molded section thereof dimensioned to fit into said one of said at least one board openings for aligning the fastener with the board; and said one of the portions including a second molded section thereof dimensioned to fit into said pilot aperture for aligning the microswitch with the fastener.

12. Apparatus comprising:
   a. a printed circuit board having at least one aperture formed therein, the board including means formed therein for receiving the fastener,
   b. a switch including a housing having at least one electrical terminal extending therefrom, the switch mounted on the board such that the at least one terminal thereof extends through the at least one board aperture, the terminal soldered to the board, the housing including means formed therein for receiving the fasteners; and
   c. a fastener for connecting the switch to the board before the at least one housing terminal is soldered thereto, and the fastener made of a molded plastic material capable of withstanding a soldering environment, and the fastener disposed within the respective receiving means;
   d. wherein the fastener is injection molded in a generally U-shaped configuration including a base portion and a pair of oppositely-spaced leg portions extending therefrom and respectively having a latch-shaped portion at the free end thereof, the base portion is disposed in engagement with the board, and the latch portions are disposed in engagement with the housing.

13. A process for connecting an electrically operable device to a printed circuit board comprising the steps of:
   a. providing a printed circuit board having at least one aperture formed therein;
   b. providing an electrically operable device including a housing having at least one electrical terminal extending therefrom;
   c. providing a fastener made of a molded plastic material capable of withstanding a soldering environment;
   d. mounting the device on the board such that each of the at least one terminals thereof extends through a different one of the at least one board apertures;
   e. connecting the device to the board by means of the fastener; and
   f. wave-soldering the terminals to the printed circuit board after the connecting step;
   g. wherein step (a) includes the step of providing at least one opening in the board, step (b) includes the step of providing at least one opening in the housing, and step (e) includes the step of inserting the fastener into each of the at least one openings.

14. The process according to claim 13, wherein step (c) includes the step of injection molding the fastener from polyetherimide plastic.

15. The process according to claim 13, wherein step (c) includes the step of integrally molding in the fastener a base portion and a latch portion opposite the base portion; and step (e) includes the steps of disposing the base portion in engagement with the board and latch portion in engagement with the housing.

16. The process according to claim 13, wherein step (c) includes the step of injection molding the fastener in a generally U-shaped configuration including a base portion and a pair of oppositely-spaced arm portions extending therefrom and respectively having a latch portion at the free end thereof; and step (e) includes the steps of disposing the base portion in engagement with the board and disposing the latch portions in engagement with the housing.

17. The process according to claim 16, wherein the step of providing at least one board opening includes the step of providing one opening having a predetermined transverse dimension; the step of providing at least one housing opening including the step of providing a pilot aperture having a predetermined transverse dimension; step (c) including the step of molding in one of the arm portions a first section thereof dimensioned to fit into said one of said at least one board openings for aligning the fastener with the board; and step (c) including the step of molding in said one of the arm portions a second section thereof dimensioned to fit into said pilot aperture for aligning the device with the fastener.

18. A process for connecting an electrically operable device to a printed circuit board comprising the steps of:
   a. providing a fastener made of a molded plastic material capable of withstanding a soldering environment;
   b. providing a printed circuit board having formed therein at least one aperture and means for receiving the fastener;
   c. providing an electrically operable device including a housing having formed therein means for receiving for fastener and having at least one electrical terminal extending therefrom;
   d. mounting the device on the board such that each of the at least one terminals thereof extends through a different one of the at least one board apertures;
   e. connecting the device to the board by means of the fastener, the connecting step including the step of disposing the fastener in the respective fastener receiving means; and
   f. wave-soldering the terminals to the printed circuit board after the connecting step;
   g. wherein step (c) includes the step of injection molding the fastener in a generally U-shaped configuration including a base portion and a pair of oppositely-spaced arm portions extending therefrom and respectively having a latch portion forming a the free end thereof, and step (e) includes the steps of disposing the base portion in engagement with the board and disposing the latch portions in engagement with the housing.

19. Apparatus comprising:
   a. a printed circuit board having at least one aperture formed therein;
   b. an electrically operable device including a housing having at least one electrical terminal extending therefrom, the device mounted on the board such that each of the at least one terminals thereof extends through a different one of the at least one board apertures, the terminals soldered to the board; and
   c. a fastener for connecting the device to the board before the at least one housing terminal is soldered thereto, and the fastener made of a molded plastic material capable of withstanding a soldering environment;

d. wherein the board includes at least one opening formed therein, the housing includes at least one opening formed therein, and the fastener is inserted into each of the at least one openings.

20. The apparatus according to claim 19, wherein the fastener is injection molded from polyetherimide plastic.

21. The apparatus according to claim 19, wherein the fastener has an integrally molded base portion and an integrally molded latch portion opposite the base portion; the base portion is disposed in engagement with the board; and the latch portion is disposed in engagement with the housing.

22. The apparatus according to claim 19, wherein the fastener is injection molded in a generally U-shaped configuration including a base portion and a pair of oppositely-spaced arm portions extending therefrom and respectively having a latch portion at the free end thereof; the base portion is disposed in engagement with the board; and the latch portions are disposed in engagement with the housing.

23. The apparatus according to claim 22, wherein the at least one board opening includes one opening having a predetermined transverse dimension; the at least one housing opening including a pilot aperture having a predetermined transverse dimension; one of the arm portions including a first molded section thereof dimensioned to fit into said one of said at least one board openings for aligning the fastener with the board; and said one of the arm portions including a second molded section thereof dimensioned to fit into said pilot apertures for aligning the device with the fastener.

24. Apparatus comprising:
a. a printed circuit board having at least one aperture formed therein;
b. an electrically operable device including a housing having at least one electrical terminal extending therefrom, the device mounted on the board such that each of the at least one terminals thereof extends through a different one of the at least one board apertures, the terminals soldered to the board; and
c. a fastener for connecting the device to the board before the at least one housing terminal is soldered thereto, and the fastener made of molded plastic material capable of withstanding a soldering environment;
d. wherein the board includes means formed therein for receiving the fastener, the housing including means formed therein for receiving the fastener, and the fastener disposed within the respective receiving means; and
e. wherein the fastener is injection molded in a generally U-shaped configuration including a base portion and a pair of oppositely-spaced arm portions extending therefrom and respectively having a latch-shaped portion forming a free end thereof, the base portion is disposed in engagement with the board, and the latch portions are disposed in engagement with the housing.

* * * * *

UNITED STATES PATENT AND TRADEMARK OFFICE
CERTIFICATE OF CORRECTION

PATENT NO. :   5,182,700
DATED      :   January 26, 1993
INVENTOR(S) :  Charles M. Weimer It is certified that error appears in the above—identified patent and that said Letters Patent is hereby corrected as shown below:

On the title page item [75]:

Charles M. Weimer
Arnold Fassman
John R. Nobile

Signed and Sealed this

Twenty-third Day of November, 1993

Attest:

BRUCE LEHMAN

Attesting Officer    Commissioner of Patents and Trademarks